(12) United States Patent
Zhang

(10) Patent No.: US 6,376,850 B1
(45) Date of Patent: Apr. 23, 2002

(54) ELECTRON BEAM APERTURE ELEMENT

(75) Inventor: Tao Zhang, Cambridge (GB)

(73) Assignee: Leica Microsystems Lithography Limited, Cambridge (GB)

( * ) Notice: Subject to any disclaimer, the term of this patent is extended or adjusted under 35 U.S.C. 154(b) by 0 days.

(21) Appl. No.: 09/423,830

(22) PCT Filed: May 14, 1998

(86) PCT No.: PCT/EP98/02853

§ 371 Date: Nov. 16, 1999

§ 102(e) Date: Nov. 16, 1999

(87) PCT Pub. No.: WO98/53481

PCT Pub. Date: Nov. 26, 1998

(30) Foreign Application Priority Data

May 16, 1997 (GB) .............................................. 9710019

(51) Int. Cl.⁷ ................................................. H01J 37/30
(52) U.S. Cl. ..................... 250/505.1; 250/310; 250/311
(58) Field of Search ............................. 250/505.1, 310, 250/311

(56) References Cited

U.S. PATENT DOCUMENTS 3,866,079 A * 2/1975 Schut ......................... 313/389
4,354,111 A 10/1982 Williams et al. ........ 250/396 R
5,981,963 A * 11/1999 Kampmeier ............. 250/492.3

FOREIGN PATENT DOCUMENTS

| FR | 2 144 742 | 2/1973 |
| GB | 1 01 172 | 11/1965 |
| GB | 2 233 536 | 1/1991 |

* cited by examiner

Primary Examiner—Jack Berman
Assistant Examiner—Anthony Quash
(74) Attorney, Agent, or Firm—Foley & Lardner

(57) ABSTRACT

An electron beam aperture element (10) comprises a body (11) provided with a passage (12) for an electron beam (E) and with a blocking surface (15) for blocking travel of part or all of the beam otherwise than through the passage. The blocking surface (15) is angled to cause departing electrons derived from the blocked beam or part thereof to be directed away from the axis (13) of the passage and, in particular, into an electron trap cavity (21) bounded by the surface (15) and a wall of a screening member (17). The wall returns electrons to the blocking surface (15) for redirection back into the cavity (21), thus preventing escape of scattered electrons or delaying their escape until sufficient absorption has taken place to render them largely harmless to the interior environment of an electron beam column equipped with the element.

13 Claims, 1 Drawing Sheet

ELECTRON BEAM APERTURE ELEMENT

FIELD OF THE INVENTION

The present invention relates to an electron beam column with at least one aperture element.

BACKGROUND OF THE INVENTION

Aperture elements are used in electron beam columns to influence beam shape or travel downstream of an electron gun and before electron emission from the column. Such an element typically consists of a body with a passage for part or all of the beam and a blocking surface adjoining an entry opening of the passage. The blocking surface usually lies at least partly in a plane perpendicular to the axis of the passage. When the element is to serve for beam shaping, such as in association with a focussing lens, the passage is calibrated at least at its entry opening and limits the beam to a desired diameter. The blocking surface extends around the entry opening and blocks onward travel of any beam electrons outside that diameter. When the element serves to control travel of the entire beam, such as in a blanking unit operable to provide transient cut-off of the beam, the beam as a whole is deflected away from the entry opening so that all beam electrons impinge on the blocking surface. The deflection is generally always to the same side of the entry opening, but for ease of construction and assembly the blocking surface completely surrounds the entry opening.

A particular problem with an aperture element used for such purposes is the deleterious effect on beam shape and/or orientation resulting from electron departure from the blocking surface. The departing electrons consist of backscattered electrons and secondary electrons, which are impelled back along the column in all directions and give rise to charge locations wherever they impinge in significant concentrations upstream of the element. If a charge location is eccentric with respect to the column axis, as is usually the case and invariably so when the electrons are issued from a blanking unit, the influence of the charge can cause distortion of the beam or deviation from strict coaxiality with the column axis. This then requires corrective measures to restore beam alignment, failing which position errors can arise in the part of the beam emitted from the column. Any such errors are of critical significance, in, for example, an electron beam lithography machine in which the beam generates a writing spot to be positioned with a tolerance of a few nanometres on an electron-sensitive substrate surface. Difficulties of this kind are evident in the column described in FR-A-72 24007, in which the beam entry side of the aperture element has the form of a cone which will deflect stray electrons into the beam itself. The exit side of the element acts as a barrier to a return beam and in part has the form of a cone for directing return beam electrons away from the beam axis, but this latter cone has no influence on electrons at the entry side.

BRIEF SUMMARY OF THE INVENTION

It is therefore the object of the invention to mitigate the effects of electrons scattered from an electron beam aperture element, in particular so as to prevent generation of undesired charge zones liable to act on the beam before entry into the element. Other objects and advantages of the invention will be apparent from the following description.

According to the present invention there is provided an electron beam column comprising a casing, generating means arranged in the casing and operable to generate an electron beam, and at least one aperture element arranged in the casing to be in the path of the beam, the aperture element comprising a body provided with a passage for travel therethrough in a given direction of at least part of an electron beam arriving from the generating means and with a blocking surface adjoining an entry opening of the passage and serving to block travel of part or all of the beam in that direction for the purpose of beam shaping or blanking, characterised in that the blocking surface is arranged to cause departing electrons derived from the blocked beam or part of the beam to be directed at an angle away from the axis of the passage and the aperture element further comprises a screening member having a wall which is co-operable with the blocking surface to bound a trap cavity for the departing electrons and which is arranged to return electrons to the blocking surface for redirection back into the trap cavity.

In the case of such an aperture element the blocking surface directs scattered electrons into the tap space, where the wall of the screening member returns the electrons to the blocking surface for further reflection and generation of scattering electrons. The geometry and relationship of the blocking surface and the wall are preferably such that the electrons remain confined to the trap space. The material of the body between the blocking surface and the boundary surface of the passage itself is sufficient to shield the beam, in the region of its travel through the passage, from influence by the charge building up in the trap space by the confined electrons.

BRIEF DESCRIPTION OF DRAWINGS

The blocking surface is preferably arranged so that the mean axis trajectory of the departing electrons forms an oblique angle with the axis of the passage at the upstream side of the element with respect to the given direction. The electrons thus have a component of movement in the direction of travel of the arriving beam and accordingly are directed away from travel back towards the beam source. Such an angle of initial departure of the electrons from the blocking surface simplifies structuring of the blocking surface and wall to keep the second and third electron generations within the trap space.

Moreover, the blocking surface, as seen in a section of the body axially of the passage, is preferably rectilinear or concave. Such surface shapes favour geometries by which the stray electrons can be confined to the trap space. If the aperture element is to have purely a blanking function, the blocking surface can be disposed merely at one side of the entry opening, in particular the side to which the beam is deflected for beam blanking. For other uses, and optionally also for blanking use, the blocking surface can entirely surround the entry opening. The surface is then preferably substantially frusto-conical in shape.

DETAILED DESCRIPTION OF THE PREFERRED EMBODIMENTS

The screening member preferably includes a shutter portion extending towards the axis of the passage and terminating at a radial spacing from the entry opening. The shutter portion thus effectively screens part of the blocking surface relative to an arriving electron beam and partially closes off the trap space. The shutter portion is preferably also spaced from the entry opening in a direction opposite to the given direction of beam travel. This simplifies the shaping of the screening member for the purpose of keeping stray electrons in the trap space and increases the volume of the space so as to reduce the charge concentration therein. The shutter portion can terminate in a circular boundary edge, which can be coaxial with, but of greater diameter than, the entry opening of the passage. The diameter is selected to allow travel of all or substantially all of the electrons of the beam to the unscreened part of the blocking surface. The actual diameter will depend on the intended use of the aperture element. If the element is to have a purely blanking function and the blocking surface is disposed only at one side of the entry opening, the boundary edge can be oval or other suitable shape allowing access to the unscreened part of the blocking surface.

The screening member preferably also includes a cylindrical portion connected to the shutter portion and extending substantially parallelly to the axis of the passage. The wall of a screening member thus constructed can, together with the blocking surface, define a trap space in the form of a cavity closed at all sides except for an entrance provided by the boundary edge of the shutter portion.

The blocking surface should, for preference, comprise a material having a low yield of both backscattered electrons and secondary electrons. A suitable material is an aluminium alloy or, to enhance wear resistance and reduce surface oxidisation, titanium. If so desired, this material can be a coating on the body.

Figure 1:
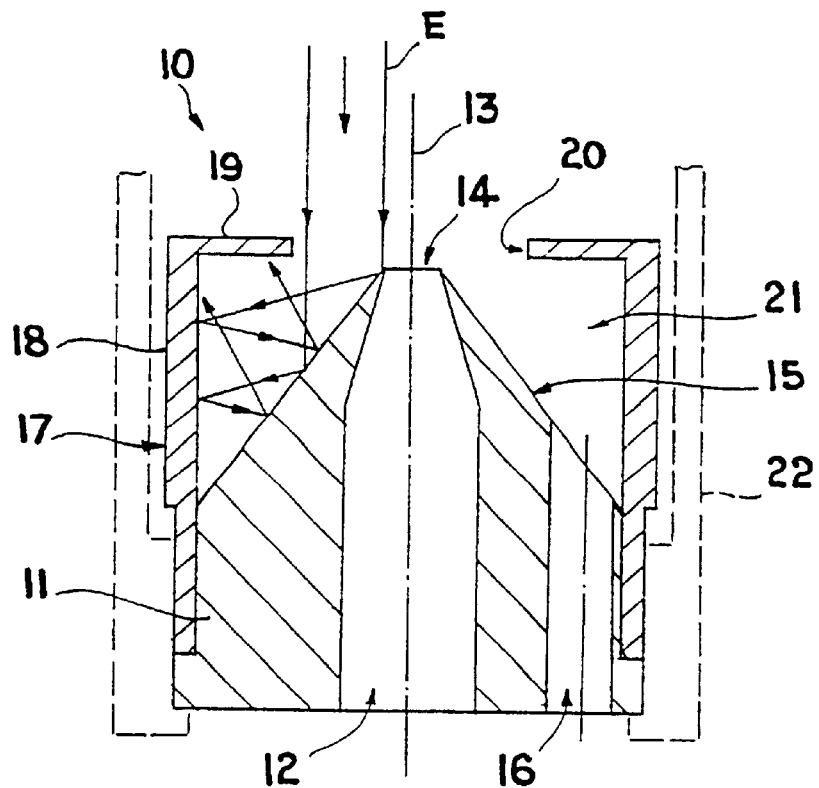
Figure 2:
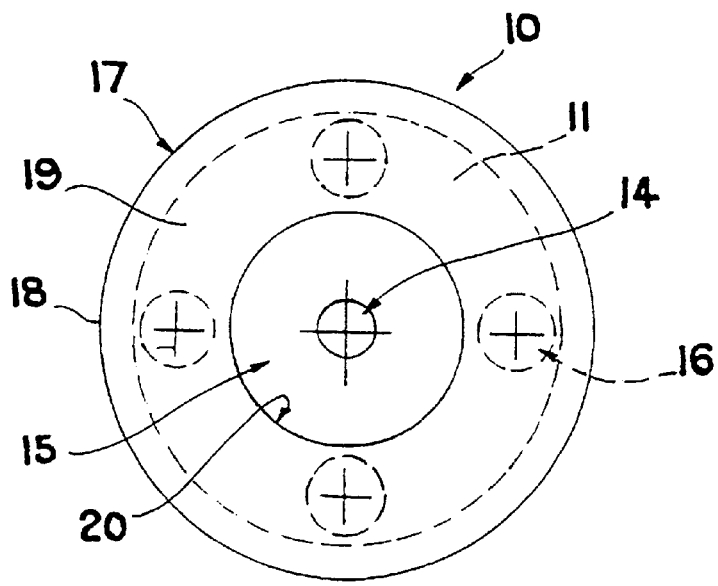

An embodiment of the invention will now be more particularly described with reference to the accompanying drawings, in which:

FIG. 1 is a sectional view of an aperture element in an electron beam column embodying the invention; and FIG. 2 is a plan view of the element.

Referring now to the drawings, there is shown an aperture element 10 mounted in an electron beam column (not shown) of, for example, an electron beam lithography machine and intended to function as a spray aperture or a blanking aperture. In the case of the present embodiment, the element is shown in use for blanking purposes.

The aperture element 10 comprises a body 11 provided with a circular section passage 12 having an axis 13. The passage 12 permits travel through the body 11 of an electron beam E which, in the installed state of the element, is emitted in the direction indicated by the arrow towards an entry opening 14 of the passage. The passage is defined by a main wall portion of constant diameter and an entry end portion which tapers inwardly to the entry opening 14. The diameter of the entry opening determines the diameter of the beam permitted to enter the passage and can be calibrated to exert a predetermined shaping or focussing effect on the beam.

The entry opening 14 is surrounded by a frusto-conical blocking surface 15 which, at the upstream side of the element, includes an angle of at least 135° with the axis 13. A preferred angle is about 140°. Due to the angle of the blocking surface 15 and that of the inwardly tapered entry end portion of the passage 12, a sharp edge arises at the entry opening 14 to provide a clear division between electrons admitted to and electrons excluded from the passage 12.

Since, in its installed state, the aperture element 10 usually forms a partition in the evacuated interior of an electron beam column, the body 11 is also provided with a plurality of vacuum pumping holes 16 in the illustrated embodiment four to permit equalisation of vacuum either side of the element.

The aperture element 10 further comprises a screening member 17 composed of a cylindrical wall portion 18 concentric with the axis 13 and connected to the body 11 and of a planar shutter portion 19 disposed at an axial spacing from the entry opening 14 in a direction away from the body and extending from the cylindrical wall portion 10 towards the axis 13. The shutter portion 19 is terminated by a circular boundary edge 20 coaxial with, but of greater diameter than, the entry opening 14. The diameter of the boundary edge 20 is such as to allow the beam E, when deflected from the axis 13 as shown in FIG. 1, to impinge on the blocking surface 15 without entering the passage 12 and also without having to impinge on the outwardly facing surface of the shutter portion 19. The inner wall of the screening member 17 and the blocking surface 15 of the body 11 together bound an electron trap cavity 21 which is closed at all sides apart from the entrance provided by the boundary edge 20. Closure of the cavity 21 remote from this entrance is provided by the connection of the cylindrical wall portion 18 to the body 11, the former engaging around a cylindrical portion of the latter and resting on a step.

The body 11, or at least its blocking surface 15, consists of a metallic material with a low total electron yield. The yield, which is proportional to the atomic number of the material used, is preferably at most about 20 percent with a normal angle of incidence. For reasons of cost and electron absorption properties, an aluminium-based alloy is preferred. Greater protection against surface deterioration, for example due to oxidisation, can be achieved with use of other metallic materials, such as titanium. The screening wall member 17 should also be made of a low yield material, preferably the same as that of the body 11.

In use, the aperture element 19 is mounted in an electron beam column by way of a suitable carrier 22. When the column is that of an electron beam lithography machine, the element can serve as a spray aperture ahead of or after a blanking unit or can serve as a blanking aperture—as in the case of the illustrated embodiment—after a beam deflector of a blanking unit. Such a deflector deflects the beam E entirely away from the axis 13 of the passage 12 so that all the beam electrons collide with the blocking surface 15 without entry into the passage. Further travel of the beam down the column is thus arrested, so that the beam is blanked to cut-off writing action on a substrate below the column. The configuration of the trap cavity 21, in particular the cone angle of the blocking surface 15 and the disposition and dimensions of the inner wall surfaces of the cylindrical wall portion 18 and shutter portion 19 of the screening member 17, is such that electrons scattered from the beam E depart from the blocking surface 15, as first generation electrons, at an oblique angle towards the wall of the cavity. From there, second generation electrons are redirected back to the blocking surface 15. At the surface 15, third generation electrons are returned to the wall of the cavity. The path of the electrons is indicated by arrowed lines, which denote mean trajectories of electron sprays. Further deflections of electrons within the trap cavity 21 can take place if the cavity geometry is such as to preclude or further delay escape of electrons, but subsequent to the third generation the adsorption by the low yield material of the body 11 and member 17 is such that electrons escaping the cavity will have little or no significant effect elsewhere in the column. Confinement of scattered electrons within the cavity gives rise to a charge which is, however, shielded from the passage 12 by the material of the body 11. Consequently, the charge in the cavity has no effect on the beam when it is returned to its effective state by redeflection to travel through the passage.

The aperture element 10 embodying the invention is thus able to prevent or reduce uncontrolled scatter of electrons which might otherwise charge the surfaces facing the electron beam. Consequently, drift of the beam position due to electron charging is eliminated or reduced.

What is claimed is:

1. An electron beam column comprising:

a casing;

a generator arranged in the casing and operable to generate an electron beam; and an aperture element arranged in the casing in the path of the electron beam, the aperture element (10) comprising a body (11) provided with a passage (12) having an axis (13) for travel therethrough in a given direction of at least part of the electron beam (E) arriving from the generator and with a blocking surface (15) adjoining an entry opening (14) of the passage to block travel of part or all of the beam in that direction for beam shaping or blanking, wherein the blocking surface (15) is arranged to cause blocked electrons derived from the beam or part of the beam to be directed at an angle away from the axis (13) of the passage, a shutter portion (19) extending towards the axis (13) of the passage and terminating at a radial spacing from the entry opening (14), and a screening member (17) having a wall which is co-operable with the blocking surface (15) and the shutter portion (19) to bound a trap cavity (21) for blocked electrons and which is arranged to return electrons to the blocking surface (15) for redirection back into the trap cavity (21), wherein the body (11) has a thickness between the blocking surface (15) and an interior surface of the passage (12) sufficient to shield electrons within the passage from influence of charge build up in the trap cavity (21).

2. An electron beam column according to claim 1, wherein the blocking surface (15) is arranged so that the mean axis trajectory of the blocked electrons forms an oblique angle with the axis (13) of the passage at the upstream side of the aperture element.

3. An electron beam column according to claim 1, characterised in that the blocking surface (15) is rectilinear in a section of the body axially of the passage.

4. An electron beam column according to claim 1, characterised in that the blocking surface is concave in a section of the body axially of the passage.

5. An electron beam column according to claim 1, characterised in that the blocking surface (15) is disposed only at one side of the entry opening (14).

6. An electron beam column according to claim 1, characterised in that the blocking surface (15) entirely surrounds the entry opening (14).

7. An electron beam column according to claim 6, characterised in that the blocking surface (15) is substantially frusto-conical.

8. An electron beam column according to claim 1, wherein the shutter portion (19) is spaced from the entry opening (14) in a direction opposite the given direction.

9. An electron beam column according to claim 1, wherein the shutter portion (19) terminates in a circular boundary edge (20).

10. An electron beam column according to claim 1, wherein the screening member (17) includes a cylindrical portion (18) connected to the shutter portion (19) and extending substantially parallelly to the axis (13) of the passage.

11. An electron beam column according to claim 1, wherein the blocking surface (15) comprises a material having a low scattered electron yield under electron bombardment.

12. An electron beam column according to claim 11, wherein the material consists of a coating on part of the body.

13. An electron beam column according to claim 1, wherein the passage is defined by a bore having a main portion of substantially constant diameter and an entry end portion tapering inwardly to the entry opening.

* * * * *